(12) United States Patent
Yean et al.

(10) Patent No.: US 7,145,228 B2
(45) Date of Patent: Dec. 5, 2006

(54) MICROELECTRONIC DEVICES

(75) Inventors: Tay Wuu Yean, Singapore (SG); Victor Tan Cher Khng, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/186,534

(22) Filed: Jul. 21, 2005
(Under 37 CFR 1.47)

(65) Prior Publication Data

US 2006/0006534 A1    Jan. 12, 2006

Related U.S. Application Data

(62) Division of application No. 10/653,008, filed on Aug. 28, 2003, now Pat. No. 6,946,325.

(30) Foreign Application Priority Data

Mar. 14, 2003    (SG)    ................ 200301649

(51) Int. Cl.
    *H01L 23/04* (2006.01)
(52) U.S. Cl. .............. 257/698; 257/724; 257/774
(58) Field of Classification Search .............. None
    See application file for complete search history.

(56) References Cited

U.S. PATENT DOCUMENTS

| 3,679,941 A | 7/1972 | LaCombe et al. |
| 5,111,278 A | 5/1992 | Eichelberger |
| 5,128,831 A | 7/1992 | Fox, III et al. |
| 5,252,857 A | 10/1993 | Kane et al. |
| 5,518,957 A | 5/1996 | Kim |
| 5,593,927 A | 1/1997 | Farnworth |
| 5,765,277 A | 6/1998 | Jin et al. |
| 5,851,845 A | 12/1998 | Wood et al. |
| 5,883,426 A | 3/1999 | Tokuno et al. |
| 5,891,797 A | 4/1999 | Farrar |
| 5,933,713 A | 8/1999 | Farnworth |

(Continued)

FOREIGN PATENT DOCUMENTS

JP    8-115953 A    5/1996

(Continued)

OTHER PUBLICATIONS

Shellcase Inc., "Wafer Level Packaging, ShellBGA Process Flow," 12 pages, Nov. 2001, <http://www.shellcase.com/Attach/ShellBGA_Process_Flow- Dec._2001.pdf>.

(Continued)

*Primary Examiner*—Alonzo Chambliss
(74) *Attorney, Agent, or Firm*—Perkins Coie LLP

(57) ABSTRACT

Methods for packaging microelectronic devices and microelectronic devices formed by such methods are disclosed herein. In one embodiment, a method includes coupling a plurality of microelectronic dies to a support member, covering the dies and at least a portion of the support member with a dielectric layer, forming a plurality of vias through the dielectric layer between the dies, and fabricating a plurality of conductive links in corresponding vias. In another embodiment, a plurality of microelectronic devices includes a support member, a plurality of microelectronic dies coupled to the support member, a dielectric layer over the dies and at least a portion of the support member, and a plurality of conductive links extending from a first surface of the dielectric layer to a second surface. The dies include an integrated circuit and a plurality of bond-pads coupled to the integrated circuit, and the conductive links are disposed between the dies.

21 Claims, 4 Drawing Sheets

U.S. PATENT DOCUMENTS

| | | | |
|---|---|---|---|
| 5,946,553 | A | 8/1999 | Wood et al. |
| 5,986,209 | A | 11/1999 | Tandy |
| 5,990,566 | A | 11/1999 | Farnworth et al. |
| 6,004,867 | A | 12/1999 | Kim et al. |
| 6,008,070 | A | 12/1999 | Farnworth |
| 6,018,249 | A | 1/2000 | Akram et al. |
| 6,020,624 | A | 2/2000 | Wood et al. |
| 6,020,629 | A | 2/2000 | Farnworth et al. |
| 6,028,365 | A | 2/2000 | Akram et al. |
| 6,051,878 | A | 4/2000 | Akram et al. |
| 6,072,233 | A | 6/2000 | Corisis et al. |
| 6,072,236 | A | 6/2000 | Akram et al. |
| 6,089,920 | A | 7/2000 | Farnworth et al. |
| 6,097,087 | A | 8/2000 | Farnworth et al. |
| 6,107,122 | A | 8/2000 | Wood et al. |
| 6,124,634 | A | 9/2000 | Akram et al. |
| 6,130,474 | A | 10/2000 | Corisis |
| 6,148,509 | A | 11/2000 | Schoenfeld et al. |
| 6,150,717 | A | 11/2000 | Wood et al. |
| 6,175,149 | B1 | 1/2001 | Akram |
| 6,184,465 | B1 | 2/2001 | Corisis |
| 6,187,615 | B1 | 2/2001 | Kim et al. |
| 6,188,232 | B1 | 2/2001 | Akram et al. |
| 6,201,304 | B1 | 3/2001 | Moden |
| 6,212,767 | B1 | 4/2001 | Tandy |
| 6,214,716 | B1 | 4/2001 | Akram |
| 6,225,689 | B1 | 5/2001 | Moden et al. |
| 6,228,687 | B1 | 5/2001 | Akram et al. |
| 6,232,666 | B1 | 5/2001 | Corisis et al. |
| 6,235,552 | B1 | 5/2001 | Kwon et al. |
| 6,235,554 | B1 * | 5/2001 | Akram et al. ............... 438/109 |
| 6,239,489 | B1 | 5/2001 | Jiang |
| 6,247,629 | B1 | 6/2001 | Jacobson et al. |
| 6,258,623 | B1 | 7/2001 | Moden et al. |
| 6,265,766 | B1 | 7/2001 | Moden |
| 6,281,042 | B1 | 8/2001 | Ahn et al. |
| 6,281,577 | B1 | 8/2001 | Oppermann et al. |
| 6,285,204 | B1 | 9/2001 | Farnworth |
| 6,294,839 | B1 | 9/2001 | Mess et al. |
| 6,297,547 | B1 | 10/2001 | Akram |
| 6,303,981 | B1 | 10/2001 | Moden |
| 6,326,697 | B1 | 12/2001 | Farnworth |
| 6,326,698 | B1 | 12/2001 | Akram |
| 6,329,222 | B1 | 12/2001 | Corisis et al. |
| 6,331,221 | B1 | 12/2001 | Cobbley |
| 6,407,381 | B1 | 6/2002 | Glenn et al. |
| 6,429,528 | B1 | 8/2002 | King et al. |
| 6,437,586 | B1 | 8/2002 | Robinson |
| 6,451,624 | B1 | 9/2002 | Farnworth et al. |
| 6,483,044 | B1 | 11/2002 | Ahmad |
| 6,501,165 | B1 | 12/2002 | Farnworth et al. |
| 6,503,780 | B1 | 1/2003 | Glenn et al. |
| 6,521,485 | B1 | 2/2003 | Su et al. |
| 6,548,376 | B1 | 4/2003 | Jiang |
| 6,552,910 | B1 | 4/2003 | Moon et al. |
| 6,560,117 | B1 | 5/2003 | Moon |
| 6,576,531 | B1 | 6/2003 | Peng et al. |
| 6,590,291 | B1 | 7/2003 | Akagawa |
| 6,607,937 | B1 | 8/2003 | Corisis |
| 6,614,092 | B1 | 9/2003 | Eldridge et al. |
| 6,614,104 | B1 | 9/2003 | Farnworth et al. |
| 6,646,334 | B1 | 11/2003 | Hur |
| 6,700,210 | B1 | 3/2004 | Smith |
| 6,746,894 | B1 | 6/2004 | Fee et al. |
| 6,753,207 | B1 | 6/2004 | Hur |
| 6,770,971 | B1 | 8/2004 | Kouno et al. |
| 6,847,109 | B1 | 1/2005 | Shim |
| 6,858,892 | B1 | 2/2005 | Yamagata |
| 6,946,325 | B1 * | 9/2005 | Yean et al. ................. 438/112 |
| 2004/0110323 | A1 | 6/2004 | Becker et al. |
| 2004/0245608 | A1 | 12/2004 | Huang et al. |

FOREIGN PATENT DOCUMENTS

JP        2001-298149 A        10/2001

OTHER PUBLICATIONS

Shinko Electric Industries Co., Ltd., "Chip BGA," 1 page, 2001, <http://www.shinko.co.jp/e_product/e_wlp/e_chipbga.htm>.

Shinko Electric Industries Co., Ltd., "Super CSP," 1 page, 2001, <http://www.shinko.co.jp/e_product/e_wlp/e_scsp.htm>.

Shellcase, Inc., "Wafer Level Packaging, ShellOP Process Flow," 10 pages, Oct. 2001, <http://www.shellcase.com/Attach/ShellOP_Process_Flow_Oct._2001.pdf>.

Towle, Steven N. et al., "Bumpless Build-Up Layers Packaging," 7 pages, Nov. 12, 2001, <ftp://download.intel.com/research/sillicon/BBULASME1101paper.pdf>.

Intel Corporation, "Bumpless Build-Up Layer Packaging Technology Backgrounder," 4 pages, Oct. 8, 2001, <ftp://download.intel.com/research/silicon/BBULBackgrounder.pdf>.

Search Report and Written Opinion for Singapore Application No. 200301649-0, 15 pages, mailed Jan. 9, 2006.

* cited by examiner

MICROELECTRONIC DEVICES

CROSS-REFERENCE TO RELATED APPLICATIONS

This application is a divisional of U.S. application Ser. No. 10/653,008, filed Aug. 28, 2003 now U.S. Pat. No. 6,946,325, which claims foreign priority benefits of Singapore Application No. 200301649-0 filed Mar. 14, 2003, both of which are incorporated herein by reference in their entireties.

TECHNICAL FIELD

The present invention relates to packaging microelectronic devices and, in particular, methods for packaging microelectronic devices at the wafer level and microelectronic devices formed by such methods.

BACKGROUND

Microelectronic devices are used in cell phones, pagers, personal digital assistants, computers, and many other products. A packaged microelectronic device can include a microelectronic die, an interposer substrate or lead frame attached to the die, and a molded casing around the die. The microelectronic die generally has an integrated circuit and a plurality of bond-pads coupled to the integrated circuit. The bond-pads are coupled to terminals on the interposer substrate or lead frame. The interposer substrate can also include ball-pads coupled to the terminals by traces in a dielectric material. An array of solder balls is configured so that each solder ball contacts a corresponding ball-pad to define a "ball-grid array." Packaged microelectronic devices with ball-grid arrays are generally higher grade packages that have lower profiles and higher pin counts than conventional packages that use a lead frame.

Packaged microelectronic devices are typically made by (a) forming a plurality of dies on a semiconductor wafer, (b) cutting the wafer to singulate the dies, (c) attaching individual dies to an interposer substrate, (d) wire-bonding the bond-pads of the dies to the terminals of the interposer substrate, and (e) encapsulating the dies with a molding compound. It is, however, time consuming and expensive to mount individual dies to interposer substrates or lead frames. Also, as the demand for higher pin counts and smaller packages increases, it becomes more difficult to form robust wire-bonds that can withstand the forces involved in molding processes. Moreover, the handling processes for attaching individual dies to interposer substrates or lead frames may damage the bare dies. Packaging processes, therefore, have become a significant factor in producing semiconductor devices and other types of microelectronic devices.

Another process for packaging microelectronic devices is wafer-level packaging. In wafer-level packaging, a plurality of microelectronic dies are formed on a wafer, and then a redistribution layer is formed over the dies. The redistribution layer has a dielectric layer, a plurality of ball-pad arrays on the dielectric layer, and conductive traces in the dielectric layer that are coupled to individual ball-pads of the ball-pad arrays. Each ball-pad array is arranged over a corresponding die, and the ball-pads in each array are coupled to corresponding bond-pads of the corresponding die by conductive traces. After forming the redistribution layer on the wafer, a highly accurate stenciling machine deposits discrete masses of solder paste onto the individual ball-pads. The solder paste is then reflowed to form small solder balls or "solder bumps" on the ball-pads. After forming the solder balls, the wafer is singulated to separate the individual microelectronic devices from one another.

Wafer-level packaging is a promising development for increasing efficiency and reducing the cost of manufacturing microelectronic devices. By "pre-packaging" individual dies with a redistribution layer before cutting the wafers to singulate the dies, sophisticated semiconductor processing techniques can be used to form smaller arrays of solder balls. Additionally, wafer-level packaging is an efficient process that simultaneously packages a plurality of dies, thereby reducing costs and increasing throughput.

Packaged microelectronic devices can also be produced by "build-up" packaging. For example, a sacrificial substrate can be attached to a panel that includes a plurality of microelectronic dies and an organic filler that couples the dies together. The sacrificial substrate is generally a ceramic disc and it is attached to the active side of the dies. Next, the back side of the dies is thinned and a ceramic layer is attached to the back side. The sacrificial substrate is then removed from the active side of the dies and build-up layers or a redistribution layer is formed on the active side of the dies.

The build-up packaging process, however, has several drawbacks. For example, the build-up process is relatively expensive and may not be used on equipment set up for circular substrates. Furthermore, the resulting packaged microelectronic devices may not be stacked on top of each other to reduce the surface area or "footprint" of the devices on a printed circuit board. Accordingly, there is a need for an efficient and cost-effective process to package microelectronic devices that are stackable.

SUMMARY

The present invention is directed toward methods for packaging microelectronic devices and microelectronic devices formed by such methods. One aspect of the invention is directed toward a method for packaging microelectronic devices including microelectronic dies having a first side with a plurality of bond-pads and a second side opposite the first side. In one embodiment, the method includes providing a plurality of singulated microelectronic dies, coupling the individual dies to a support member, covering the dies and at least a portion of the support member with a dielectric layer, forming a plurality of vias through the dielectric layer between the dies, and fabricating a plurality of conductive links in corresponding vias. The conductive links can be electrically coupled to the dies.

In one aspect of this embodiment, providing the dies includes forming the dies on a microelectronic workpiece and cutting the microelectronic workpiece to separate the dies from each other before coupling the dies to the support member. The dies can be spaced apart by a first distance on the microelectronic workpiece and a second distance on the support member. The second distance is greater than the first distance such that the dies are spaced farther apart from each other on the support member than when they are part of the workpiece. In another aspect of this embodiment, the method can include forming apertures in the support member that are aligned with corresponding vias in the dielectric layer. The conductive links can extend into the apertures. In another aspect of this embodiment, the method can include removing the support member from the dies and the dielectric layer.

Another aspect of the invention is directed toward a plurality of microelectronic devices. In one embodiment, the microelectronic devices include a support member, a plurality of microelectronic dies coupled to the support member, a dielectric layer over the dies and at least a portion of the support member, and a plurality of conductive links extending from a first surface of the dielectric layer to a second surface of the dielectric layer. The dies include an integrated circuit and a plurality of bond-pads coupled to the integrated circuit, and the conductive links are disposed between the dies. In one aspect of this embodiment, the support member includes apertures and the conductive links are at least partially disposed in corresponding apertures. In another aspect of this embodiment, the devices further include a cover over at least a portion of the dielectric layer. In another aspect of this embodiment, the devices further include a plurality of pads in and/or on the support member that are electrically coupled to corresponding conductive links. The pads may not be aligned with the conductive links.

BRIEF DESCRIPTION OF THE DRAWINGS

FIG. 1A is a schematic side cross-sectional view of a microelectronic workpiece having a plurality of microelectronic dies.

FIG. 1B is a schematic side cross-sectional view of a plurality of microelectronic devices after attaching the microelectronic dies to a mounting member.

FIG. 1C is a schematic side cross-sectional view of the microelectronic devices after forming a plurality of conductive lines.

FIG. 1D is a schematic side cross-sectional view of the microelectronic devices after forming a plurality of ball-pads and a plurality of conductive links.

FIG. 1E is a schematic side cross-sectional view of the microelectronic devices after forming a second portion of the conductive links in the support member.

FIG. 1F is a schematic side cross-sectional view of an upper microelectronic device stacked on top of a lower microelectronic device.

DETAILED DESCRIPTION

The following disclosure describes several embodiments of microelectronic devices and methods for packaging microelectronic devices. Many specific details of the present invention are described below with reference to semiconductor devices. The term "microelectronic workpiece," however, is used throughout to include substrates upon which and/or in which microelectronic devices, micromechanical devices, data storage elements, read/write components, and other features are fabricated. For example, microelectronic workpieces can be semiconductor wafers (e.g., silicon or gallium arsenide wafers), glass substrates, insulative substrates, and many other types of substrates. Many specific details of several embodiments of the invention are described below with reference to microelectronic devices including microelectronic dies in order to provide a thorough understanding of such embodiments. A person of ordinary skill in the art will understand, however, that the invention may have other embodiments with additional elements or without several of the elements shown and described with reference to the embodiments of FIGS. 1A–3.

A. Microelectronic Devices and Methods for Packaging Microelectronic Devices

Figure 1A:
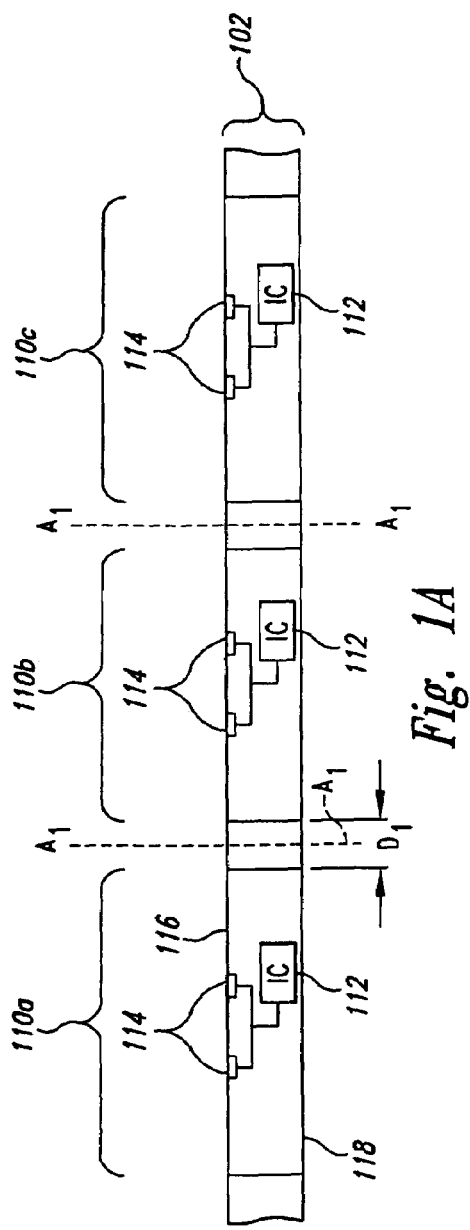
FIGS. 1A–1F illustrate various stages in a method of packaging microelectronic devices in accordance with one embodiment of the invention.

FIGS. 1A–1F illustrate various stages in a method of packaging microelectronic devices in accordance with one embodiment of the invention. FIG. 1A, more specifically, is a schematic side cross-sectional view of a microelectronic workpiece 102 having a plurality of microelectronic dies 110 (identified individually as 110a–c). The microelectronic dies 110 can include an integrated circuit 112, a first side 116 having a plurality of bond-pads 114 electrically coupled to the integrated circuit 112, and a second side 118 opposite the first side 116. The dies 110 are typically individual components such that the integrated circuits 112 and bond-pads 114 are specific to each die 110. The dies 110 are formed on the microelectronic workpiece 102 in an arrangement in which the dies 110 are spaced apart from each other by, at most, a first distance $D_1$. After forming the dies 110, the microelectronic workpiece 102 is cut along lines $A_1$—$A_1$ to singulate the dies 110.

Figure 1B:
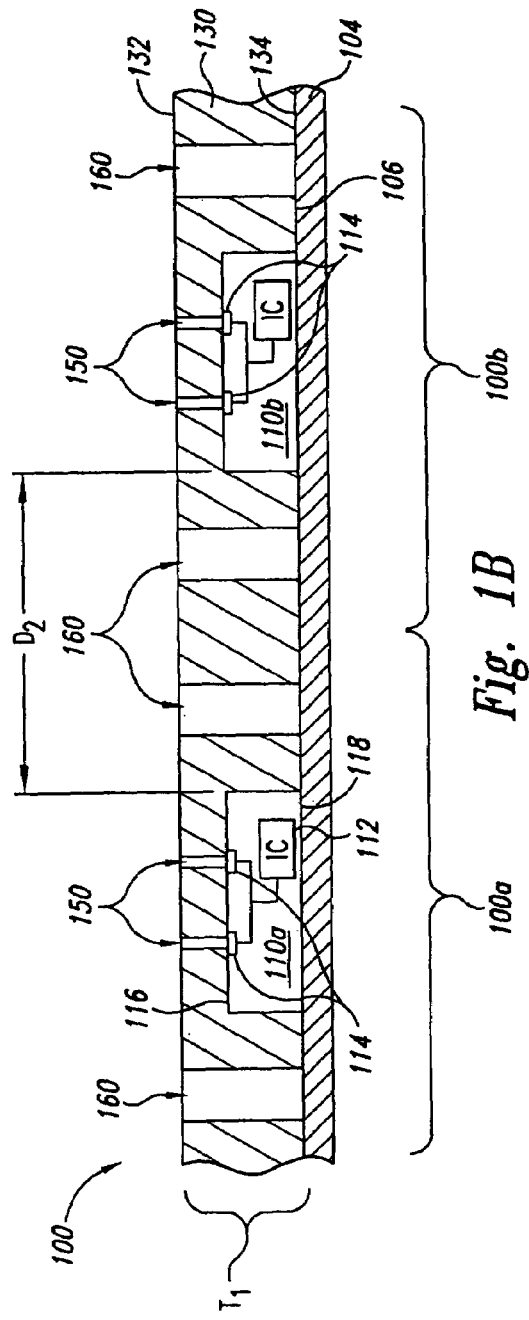

FIG. 1B is a schematic side cross-sectional view of a plurality of microelectronic devices 100 (identified individually as 100a–b) after attaching the microelectronic dies 110 to a support member 104. After cutting the workpiece 102 of FIG. 1A to separate the dies 110 into individual devices, the second side 118 of the microelectronic dies 110 can be attached to a first surface 106 of the support member 104. The support member 104 can be a separate substrate made of silicon, glass, or other suitable materials. Moreover, the support member 104 can be a tape, such as a polyimide tape or wafer-mounting tape. The dies 110 are arranged such that the dies 110 are spaced apart from adjacent dies 110 by at least a second distance $D_2$. The second distance $D_2$ is greater than the first distance $D_1$ (FIG. 1A), and thus the spacing between the dies 110 is greater on the support member 104 than on the workpiece 102 (FIG. 1A). In one aspect of this embodiment, the microelectronic dies 110 can be tested to ensure that they function properly before they are attached to the support member 104 to enhance the reliability of the packaged microelectronic devices 100.

After attaching the dies 110 to the support member 104, a first dielectric layer 130 is deposited across the dies 110 and across the exposed areas of the first surface 106 of the support member 104 between the dies 110. The first dielectric layer 130 has a first surface 132, a second surface 134 opposite the first surface 132, and a thickness $T_1$. A plurality of vias 150 and 160 are then formed in the dielectric layer 130. More specifically, portions of the first dielectric layer 130 directly above the bond-pads 114 of the dies 110 are removed to form the vias 150 that extend from the first surface 132 of the first dielectric layer 130 to the bond-pads 114. In addition, portions of the first dielectric layer 130 between the dies 110 are removed to form the vias 160. The vias 160 extend from the first surface 132 of the first dielectric layer 130 to the second surface 134. In this embodiment, two of the vias 160 are illustrated between the dies 110. In other embodiments, however, a different number of the vias 160 can be formed in the first dielectric layer 130 between the dies 110. The vias 150 and 160 can be formed by etching, drilling, or other suitable methods.

Figure 1C:
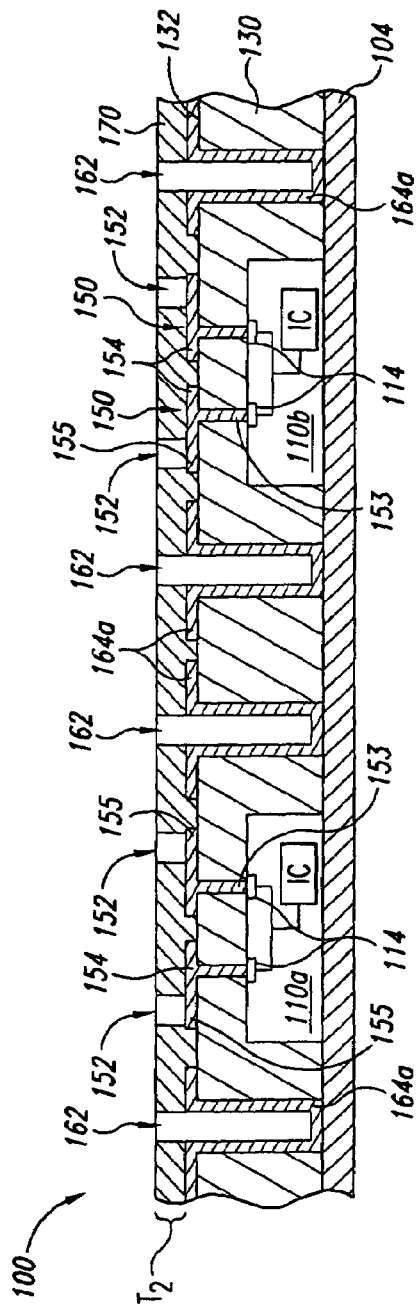

FIG. 1C is a schematic side cross-sectional view of the microelectronic devices 100 after forming a plurality of conductive lines 154 coupled to corresponding bond-pads 114. After forming the vias 150 in the first dielectric layer 130, the conductive lines 154 are formed on the microelectronic devices 100. The conductive lines 154 can be discrete traces that have a first end 153 electrically coupled to individual bond-pads 114 of the dies 110 and a second end 155 opposite the first end 153. In addition, a first portion of a plurality of conductive links 164a is formed in the vias 160. In one aspect of this embodiment, the first portions of the conductive links 164a are electrically coupled to corresponding bond-pads (not shown) on the dies 110. In other embodiments, as discussed in greater detail below, the first portion of the conductive links 164a may not be coupled to the bond-pads of the dies 110. In another aspect of this embodiment, the conductive lines 154 and the first portion of the conductive links 164a can be formed by sputtering a thin film of a conductive material across the first dielectric layer 130 including the vias 150 and 160. The conductive material can be titanium, copper or another suitable conductive material. Portions of the conductive material can be removed by etching to form the conductive lines 154 and the first portion of the conductive links 164a. In other embodiments, the conductive lines 154 and the first portion of the conductive links 164a can be formed separately and by other suitable methods.

After forming the conductive lines 154 and the first portion of the conductive links 164a, a second dielectric layer 170 is deposited across the microelectronic devices 100. Next, portions of the second dielectric layer 170 proximate to the second ends 155 of the conductive lines 154 are removed to form a plurality of vias 152. Furthermore, portions of the second dielectric layer 170 proximate to the first portion of the conductive links 164a are removed to form a plurality of vias 162.

Figure 1D:
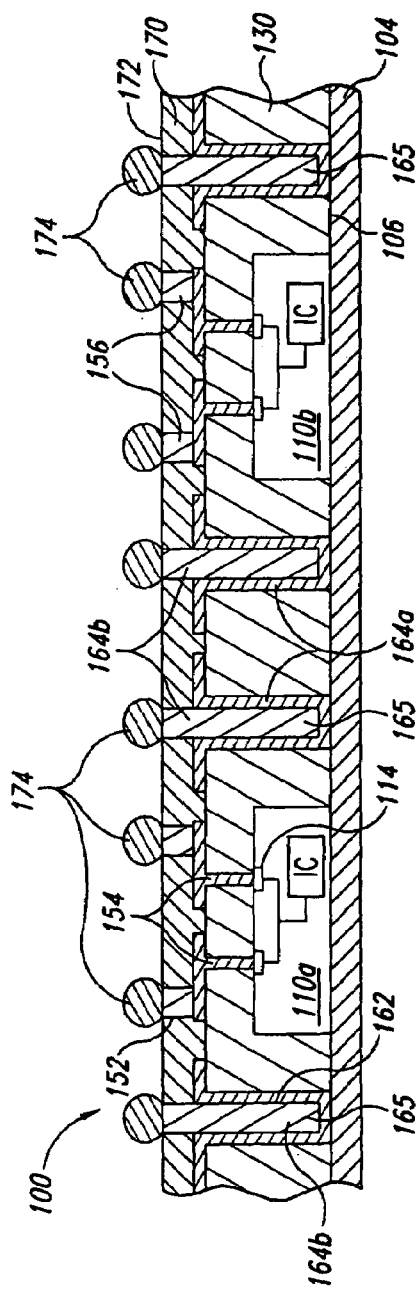

FIG. 1D is a schematic side cross-sectional view of the microelectronic devices 100 after forming a plurality of ball-pads 156 and a plurality of second portions of the conductive links 164b. After forming the vias 152 in the second dielectric layer 170, arrays of the ball-pads 156 can be formed in the vias 152. Each array of ball-pads 156 can be associated with a corresponding die 110, and each ball-pad 156 in an array can be electrically coupled to a corresponding bond-pad 114 of the die 110 by a conductive line 154. In addition, the second portion of the conductive links 164b can be formed on the first portion of the conductive links 164a in the vias 162. Together, the first and second portions of the conductive links 164a–b form a plurality of conductive links 165 that extend through the first and second dielectric layers 130 and 170 to the first surface 106 of the support member 104. Next, a plurality of solder balls 174 can be deposited on the corresponding ball-pads 156 and the corresponding conductive links 165 proximate to a first surface 172 of the second dielectric layer 170.

In one aspect of this embodiment, the second portion of the conductive links 164b can be formed by depositing solder paste into the vias 162 or electroplating a conductive material such as copper. In other embodiments, the conductive links 165 can be formed by other methods. In one aspect of this embodiment, the conductive links 165 can include ball-pads (not shown) proximate to the first surface 172 of the second dielectric layer 170. In another aspect of this embodiment, the conductive links 165 can be electrically coupled to the microelectronic dies 110. In other embodiments, the conductive links 165 can include pass-through circuitry and not be electrically coupled to the dies 110.

Figure 1E:
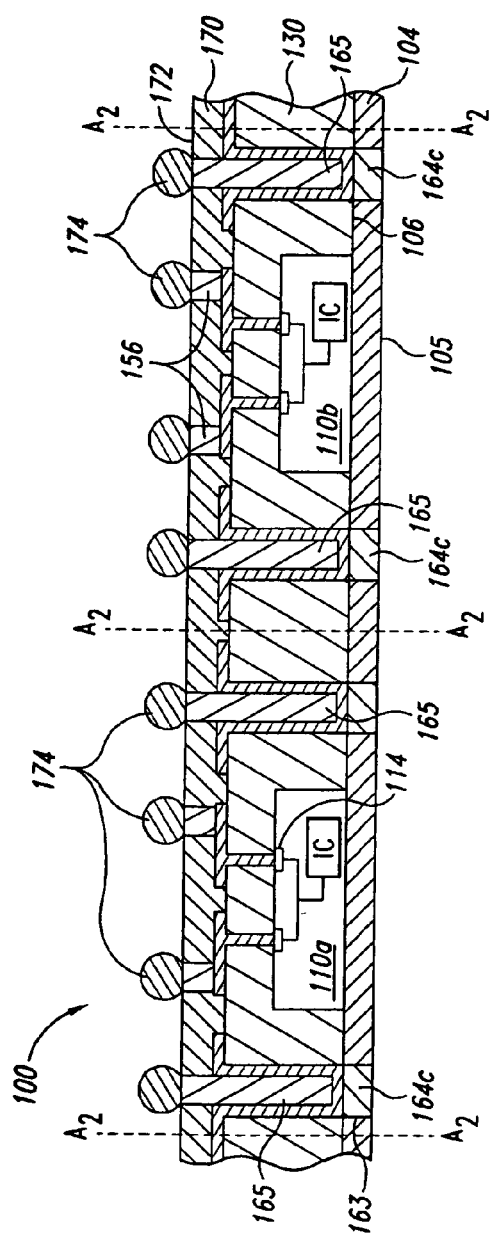

FIG. 1E is a schematic side cross-sectional view of the microelectronic devices 100 after forming a third portion of the conductive links 164c in the support member 104. In one aspect of this embodiment, portions of the support member 104 that are aligned with the conductive links 165 can be removed to create a plurality of apertures 163. Next, the third portion of the conductive links 164c can be formed in the apertures 163 and form part of the conductive links 165. The third portion of the conductive links 164c can include ball-pads or contacts. Accordingly, the conductive links 165 can extend from the first surface 172 of the second dielectric layer 170 to the second surface 105 of the support member 104. After forming the conductive links 165 through the first dielectric layer 130, the second dielectric layer 170, and the support member 104, the assembly can be cut along lines $A_2$—$A_2$ to singulate the microelectronic devices 100. In additional embodiments, such as those described below with reference to FIG. 3, the conductive links 165 may not extend through the support member 104. In other embodiments, a plurality of apertures can be formed in the support member 104 before the first dielectric layer 130 is deposited (as shown in FIG. 1B), and the first portion of the conductive links 164a can be formed in the apertures of the support member 104. In additional embodiments, portions of the support member 104 can be removed to form the apertures 163 when the vias 160 are formed in the first dielectric layer 130. In other embodiments, the solder balls can be deposited on the conductive links 165 after the conductive links 165 are formed in the support member 104.

Figure 1F:
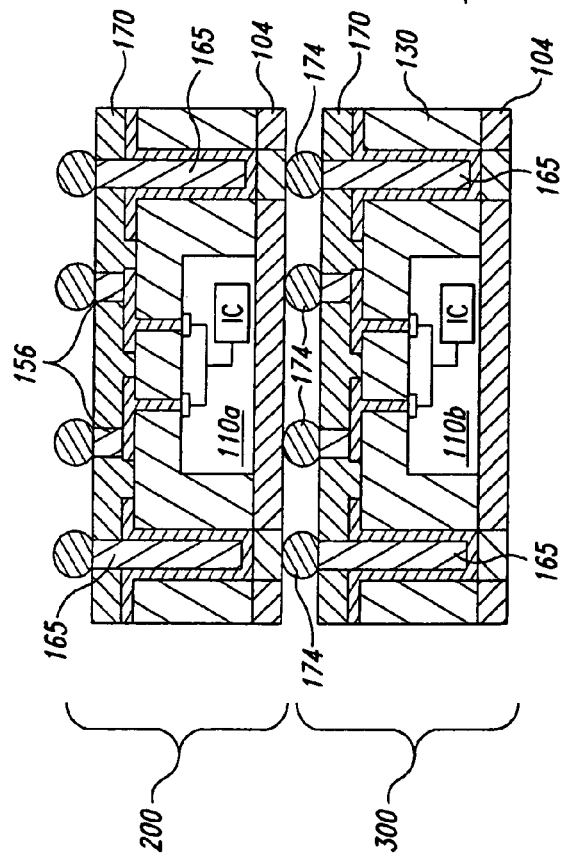

FIG. 1F is a schematic side cross-sectional view of an upper microelectronic device 200 stacked on top of a lower microelectronic device 300. The upper and lower microelectronic devices 200 and 300 can be generally similar to the microelectronic devices 100 described above with reference to FIGS. 1B–1E. For example, the upper and lower microelectronic devices 200 and 300 each include a microelectronic die 110 (identified individually as 110a–b). The microelectronic dies 110 can be the same type of die, or the dies 110 can be different types. The upper microelectronic device 200 is coupled to the lower microelectronic device 300 by attaching the conductive links 165 of the upper microelectronic device 200 to the solder balls 174 on the conductive links 165 of the lower microelectronic device 300. In this embodiment, the upper microelectronic device 200 does not include pads or contacts that are coupled to the solder balls 174 on the ball-pads 156 of the lower microelectronic device 300. In other embodiments, such as those described below with reference to FIG. 2, the ball-pads 156 of one microelectronic device can be electrically coupled to another microelectronic device when the devices are stacked. In one aspect of the illustrated embodiment, the upper microelectronic device 200 can be attached to a printed circuit board before or after the lower microelectronic device 300 is attached. In other embodiments, one microelectronic device can be attached to a support member and multiple microelectronic devices can be stacked on top of the single device.

One advantage of the microelectronic devices is that they can be stacked on top of each other. Stacking microelectronic devices increases the capacity or performance of a device within a given surface area or footprint on a circuit board. For example, when a second microelectronic device is stacked on top of a first microelectronic device, the second microelectronic device is electrically and operably coupled to the circuit board without using significantly more surface area on the circuit board. Another advantage of the microelectronic devices 100 is that the conductive links 165 and the solder balls 174 create a redistribution system with a greater pitch (i.e., greater distance between the solder balls). A greater pitch between solder balls allows for a greater pitch between corresponding contacts on a circuit board. Circuit boards with a greater pitch between contacts are cheaper and easier to manufacture. Moreover, a greater pitch may allow the microelectronic devices to use a standard rather than a custom ball-grid array pitch.

B. Other Microelectronic Devices

Figure 2:
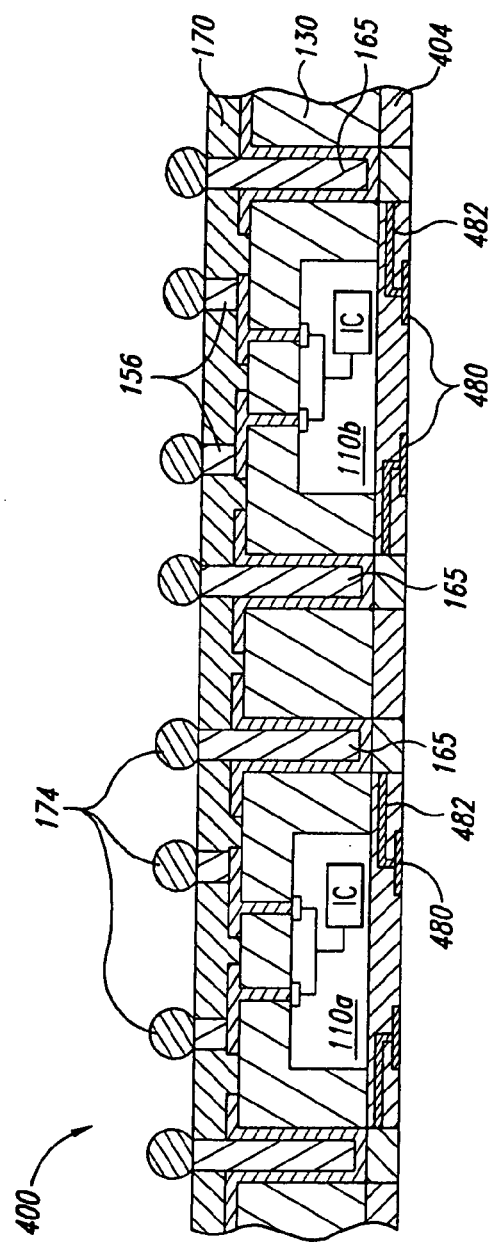
FIG. 2 is a schematic side cross-sectional view of a plurality of microelectronic devices in accordance with another embodiment of the invention.

FIG. 2 is a schematic side cross-sectional view of a plurality of microelectronic devices 400 in accordance with another embodiment of the invention. The microelectronic devices 400 are generally similar to the microelectronic devices 100 described above with reference to FIGS. 1B–1E. For example, the microelectronic devices 400 include a support member 404, a plurality of microelectronic dies 110 coupled to the support member 404, first and second dielectric layers 130 and 170 over the support member 404, a plurality of solder balls 174 on corresponding ball-pads 156 in the second dielectric layer 170, and a plurality of conductive links 165 that extend through the microelectronic devices 400. The mounting member 404 includes a plurality of pads 480 and a plurality of conductive lines 482 electrically coupling the pads 480 to corresponding conductive links 165. In one aspect of this embodiment, the mounting member 404 can be a polyimide tape having pads and interconnecting circuitry. In other embodiments, the pads 480 can be formed on and/or in the mounting member 404. The pads 480 on the microelectronic devices 400 can be arranged to contact corresponding solder balls 174 on other microelectronic devices 400 when the devices 400 are stacked.

Figure 3:
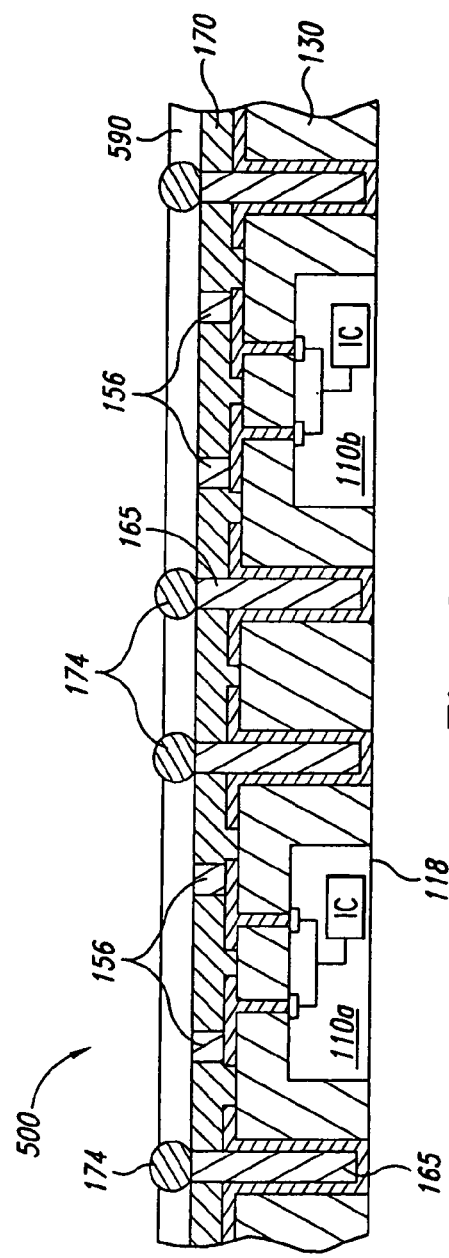
FIG. 3 is a schematic side cross-sectional view of a plurality of microelectronic devices in accordance with another embodiment of the invention.

FIG. 3 is a schematic side cross-sectional view of a plurality of microelectronic devices 500 in accordance with another embodiment of the invention. The microelectronic devices 500 are generally similar to the microelectronic devices 100 described above with reference to FIGS. 1B–1E. For example, the microelectronic devices 500 include a plurality of microelectronic dies 110, first and second dielectric layers 130 and 170 over the dies 110, a plurality of arrays of ball-pads 156 in the second dielectric layer 170, and a plurality of conductive links 165 that extend through the dielectric layers 130 and 170. In one aspect of this embodiment, the microelectronic devices 500 do not include a mounting member attached to the dies 110. The microelectronic devices 500 can be fabricated on a mounting member and the mounting member can be removed during the manufacturing process. Alternatively, the microelectronic devices 500 can be fabricated without a mounting member. The lack of a mounting member creates a thinner microelectronic device 500 and/or allows for a heat sink to be attached to the dies 110. In another aspect of this embodiment, the microelectronic devices 500 do not include solder balls on the ball-pads 156. In other embodiments, the ball-pads 156 may include solder balls. In another aspect of this embodiment, the microelectronic devices 500 are encapsulated to form a cover 590 over the second dielectric layer 170. The cover 590 protects the microelectronic devices 500 from air, dirt, moisture and other contaminants. In other embodiments, the microelectronic devices 500 may include a cover over the second side 118 of the microelectronic dies 110 and/or may not include the cover 590 over the second dielectric layer 170.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. A plurality of microelectronic devices, comprising:
a dielectric support member;
a plurality of microelectronic dies coupled to the dielectric support member, the dies having an active side facing away from the support member, an integrated circuit, and a plurality of bond-pads at the active side and coupled to the integrated circuit;
a dielectric layer over the dies and at least a portion of the support member, the dielectric layer having a first surface and a second surface opposite the first surface;
a plurality of conductive links extending from the first surface of the dielectric layer to the second surface, wherein the conductive links are between the dies; and
a plurality of pads at least partially aligned with corresponding conductive links.

2. The microelectronic devices of claim 1 wherein the support member comprises a polyimide tape.

3. The microelectronic devices of claim 1 wherein the support member comprises a plurality of apertures, and wherein the conductive links are at least partially disposed in corresponding apertures.

4. The microelectronic devices of claim 1 wherein at least a portion of the conductive links are electrically coupled to corresponding dies.

5. A plurality of microelectronic devices, comprising:
a support member;
a plurality of microelectronic dies coupled to the support member, the dies having an active side facing away from the support member, an integrated circuit, and a plurality of bond-pads at the active side and coupled to the integrated circuit;
a dielectric layer over the dies and at least a portion of the support member, the dielectric layer having a first surface and a second surface opposite the first surface;
a plurality of conductive links extending from the first surface of the dielectric layer to the second surface, wherein the conductive links are between the dies;
a plurality of ball-pads at least partially aligned with corresponding conductive links; and
a plurality of solder balls on corresponding ball-pads.

6. The microelectronic devices of claim 1, further comprising a cover over at least a portion of the dielectric layer.

7. The microelectronic devices of claim 1 wherein:
the dies comprise first and second dies; and
the conductive links comprise first and second conductive links disposed between the first and second dies.

8. A plurality of microelectronic devices, comprising:
a support member;
a plurality of microelectronic dies coupled to the support member, the dies having an active side facing away from the support member, an integrated circuit, and a plurality of bond-pads at the active side and coupled to the integrated circuit;
a dielectric layer over the dies and at least a portion of the support member, the dielectric layer having a first surface and a second surface opposite the first surface;
a plurality of conductive links extending from the first surface of the dielectric layer to the second surface, wherein the conductive links are between the dies; and
a plurality of pads at the support member, the pads being electrically coupled to corresponding conductive links and at least partially aligned with the conductive links.

9. A plurality of microelectronic devices, comprising:
a support member having a plurality of apertures;
a plurality of microelectronic dies attached to the support member, the dies having a first side with bond-pads and a second side opposite the first side and facing the support member;
a dielectric layer covering the dies and at least a portion of the support member;
a plurality of conductive links extending through the dielectric layer between the dies, the conductive links being aligned with corresponding apertures in the support member; and
a plurality of ball-pad arrays at the support member, the individual ball-pads being at least partially aligned with corresponding conductive links.

10. The microelectronic devices of claim 9 wherein the support member comprises a polyimide tape.

11. The microelectronic devices of claim 9, further comprising a plurality of solder balls on corresponding ball-pads.

12. The microelectronic devices of claim 9, further comprising a cover over at least a portion of the dielectric layer.

13. The microelectronic devices of claim 9 wherein:
the dies comprise first and second dies; and
the conductive links comprise first and second conductive links disposed between the first and second dies.

14. The microelectronic devices of claim 9 wherein the ball-pads comprise first ball-pads, and wherein the devices further comprise a plurality of second pads at the dielectric layer, the second pads being electrically coupled to corresponding dies.

15. A plurality of microelectronic devices, comprising:
a plurality of microelectronic dies having an active side with bond-pads and a back side opposite the active side;
a dielectric layer covering the active side of the dies, the dielectric layer having a first surface and a second surface opposite the first surface, the second surface being at least partially co-planar with the back side of the dies;
a plurality of conductive links extending from the first surface of the dielectric layer to the second surface, the conductive links being disposed between the dies, at least a portion of the conductive links being electrically coupled to corresponding dies; and
a plurality of ball-pad arrays at the dielectric layer and at least partially aligned with corresponding plurality of conductive links.

16. The microelectronic devices of claim 15, further comprising a plurality of solder balls on corresponding ball-pads.

17. The microelectronic devices of claim 15, further comprising a cover over at least a portion of the dielectric layer.

18. The microelectronic devices of claim 15 wherein:
the dies comprise first and second dies; and
the conductive links comprise first and second conductive links disposed between the first and second dies.

19. A plurality of microelectronic devices, comprising:
a mounting member having a first surface and a second surface opposite the first surface;
a plurality of microelectronic dies attached to the first surface of the mounting member, the dies having an active side facing away from the mounting member and a plurality of bond-pads at the active side;
a dielectric layer having a first surface and a second surface proximate to the first surface of the mounting member, the dielectric layer covering the microelectronic dies;
a first plurality of pads at the first surface of the dielectric layer;
a second plurality of pads at the second surface of the mounting member; and
a plurality of conductive links at least partially aligned with corresponding second pads and electrically coupling the first pads to corresponding second pads.

20. The microelectronic devices of claim 19 wherein the conductive links are aligned with corresponding first pads.

21. The microelectronic devices of claim 19 wherein the conductive links are electrically coupled to corresponding bond-pads.

* * * * *